United States Patent [19] [11] 3,893,157
Silzars et al. [45] July 1, 1975

[54] SEMICONDUCTOR TARGET WITH INTEGRAL BEAM SHIELD

[75] Inventors: Aris Silzars, Redwood City; Aaron Ballonoff, Sunnyvale, both of Calif.

[73] Assignees: Signetics Corporation, Sunnyvale; Watkins-Johnson Company, Palo Alto, both of Calif.

[22] Filed: June 4, 1973

[21] Appl. No.: 366,534

[52] U.S. Cl. ...................... 357/69; 357/29; 313/367
[51] Int. Cl. ................................................ H01l 5/00
[58] Field of Search ............. 317/235, 27.1, 5.4, 66; 313/367, 68; 357/29, 69

[56] References Cited

UNITED STATES PATENTS

| | | | |
|---|---|---|---|
| 3,558,366 | 1/1971 | Lepselter | 148/1.5 |
| 3,564,309 | 2/1971 | Hoeberechts et al. | 313/66 |
| 3,575,743 | 4/1971 | Chiovarou et al. | 148/187 |
| 3,676,741 | 7/1972 | Forst et al. | 317/234 |
| 3,737,701 | 6/1973 | Hoeberechts et al. | 313/66 |

*Primary Examiner*—Michael J. Lynch
*Assistant Examiner*—E. Wojciechowicz
*Attorney, Agent, or Firm*—Flehr, Hohbach, Test, Albritton & Herbert

[57] ABSTRACT

A radiation resistance PN junction diode with a radiation shield which is attached to the semiconductor device and extends over, but is separated from, portions of the device which it is desired to have shielded from radiation. The purpose of the shield is to provide a radiation resistant semiconductor target for use in planar electron bombarded semiconductor devices, electron beam recorders, and other devices requiring periodic or continuous electron beam or other low energy radiation monitoring. In accordance with a preferred method of the invention, the electron beam shield is fabricated simultaneously on each of a plurality of PN junction diodes in an array on a semiconductor wafer.

13 Claims, 7 Drawing Figures

SEMICONDUCTOR TARGET WITH INTEGRAL BEAM SHIELD

The invention described herein was made in the course of work under a grant or award from the office of Naval Research.

BACKGROUND OF THE INVENTION

In many electron bombarded semiconductor device applications, it is desirable to use diodes that can withstand large reverse bias voltages on the order of hundreds of volts with leakage currents on the order of microamperes or less. The process that has been used to make silicon diodes with the most stable electric properties is called the planar process. A typical diode made in accordance with this process consists of a shallow P-type region diffused into an N-type wafer through an etched hole in a thermally grown oxide on the silicon wafer.

The two principal difficulties or limitations in prior art semiconductor targets of this type have been (1) avalanche breakdown in the semiconductor substrate during reverse bias of the diodes due to the high intensity electric fields developed therein and (2) what can be referred to as "radiation damage". Typically, the periphery of a semiconductor substrate surrounding a PN junction diode is covered with silicon dioxide and a metal shield is positioned external to the semiconductor structure for the purpose of preventing most stray electrons or X-rays from hitting the exposed oxide. However, it is virtually impossible to position the beam shield to prevent all stray electrons or X-rays from hitting the oxide. Possibly the most serious radiation damage effects are caused by elastic primary electrons which are visible at the silicon oxide surface. Since the range of penetration of, for example, a ten KEV electron is 1.2 $\mu$m in silicon dioxide, the electrons can penetrate to a depth which is extremely close to the interface between the semiconductor substrate and the silicon dioxide. The effect of these stray electrons and x-rays (which have an even greater penetration range) is to build up a fixed positive charge near the interface of the silicon and the oxide. This charge causes a greater field to exist at the surface of the semiconductor then was there before the radiation. This radiation damage reduces the diode breakdown or avalanche voltage to a lower level than the desired operating voltage, rendering the diode unless for electron bombarded semiconductor applications.

A possible way of avoiding degradation of the breakdown voltage of PN junction diodes is to use P-type material with N-type diffusion, as is commonly done in radiation detecting devices to prevent breakdown from ionizing radiation in general. This is undesirable for electron bombarded semiconductor devices because of the drift velocity versus electric field characteristics of holes in the semiconductor, which reduces the rise time and frequency response of the diodes. Furthermore, in linear amplifier devices the hole velocity does not saturate at high electric fields within the diode and significant non-linearity is introduced into the output signal.

OBJECTS AND SUMMARY OF THE INVENTION

It is an object of this invention to provide a radiation resistant semiconductor target for use in electron beam devices.

It is another object of this invention to provide an accurately aligned electron beam mask as part of a semiconductor target structure in an electron beam device.

It is another object of this invention to provide a semiconductor target for use in an electron beam device which does not degrade under electron beam bombardment and in which the target capacitance is low.

It is still another object of the invention to provide means in an electron bombarded semiconductor target which includes protection from off axis and stray electrons and x-rays without the necessity for an accurately aligned external electron beam mask.

In accordance with one embodiment of the invention there is provided a semiconductor target spaced from an electron gun, for example, and adapted to receive an electron beam. The semiconductor target includes a semiconductor substrate of one conductivity type which has a front surface oriented toward the electron beam. A region of second conductivity type is provided in the semiconductor substrate extending down into the substrate from the front surface and defining a PN junction. A radiation or beam shield of electron absorbing material is provided. The semiconductor substrate front surface mounts the electron beam shield to the substrate in spaced relationship thereto. The beam shield extends out over the periphery of the semiconductor substrate adjacent the PN junction for shielding the periphery from the electron beam. The beam shield has a central opening generally coextensive with an inner area of the front surface of the region of second conductivity type for permitting the electron beam to strike the inner area.

DESCRIPTION OF THE PREFERRED EMBODIMENTS

Figure 1:
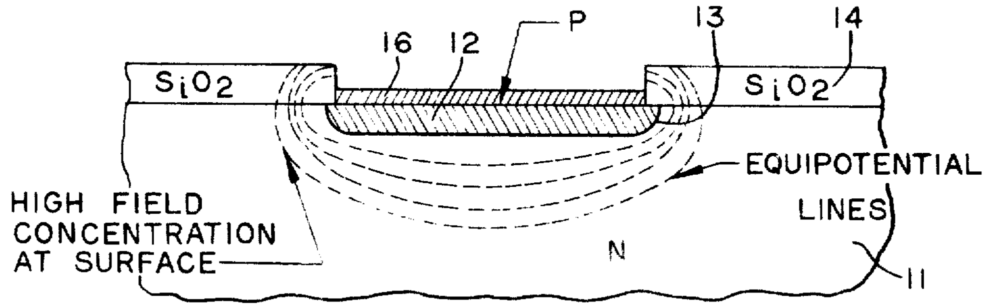
FIG. 1 is a schematic cross-sectional view of a typical diode structure for use in an electron bombarded semiconductor.

Turning to a consideration of FIG. 1, there is shown a schematic cross-section of a typical diode structure for use in an electron bombarded semiconductor device. A semiconductor substrate 11, which may be N-type silicon for example, is provided with a P-type region 12 appropriately formed therein as by diffusion for example. The P-type region 12 together with the N-type substrate 11 form a PN junction 13. A layer of insulating material 14 such as silicon dioxide is disposed on the top surface of the semiconductor substrate 11 and overlies the periphery of the substrate surrounding the PN junction 13 as well as the portions of the PN junction 13 which extend up to the top surface. Metallization 16 is provided contacting an inner area of the top surface of the P-type region 12 for providing an electrical contact to the P-type region 12.

The dotted lines in FIG. 1 represent equipotential lines when the PN junction diode of FIG. 1 is subjected to large reverse bias voltages, as is the case in electron bombarded semiconductor device applications. In FIG. 1 the spacing of the equipotential lines is related to the electric field intensity under the reverse bias condition, the closer spacing corresponding to the higher intensity fields. When the electric field intensity within the semiconductor substrate 11 reaches a critical value, the electrons in the silicon substrate are accelerated to the point where they collide with other electrons, causing a regenerative condition called avalanche breakdown in which the current increases very rapidly for small changes in voltage. For electron bombarded semiconductor devices and the like it is desired to avoid operation in the avalanche breakdown condition. With the construction shown in FIG. 1 it can be appreciated that there is a high electric field concentration near the surface of the semiconductor substrate as indicated by the closely spaced equipotential lines, which can lead to the avalanche breakdown condition.

Figure 2:
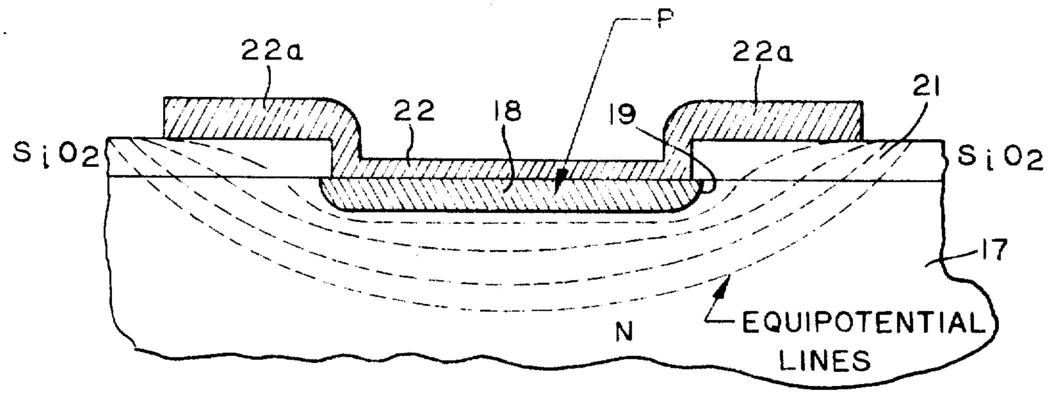
FIG. 2 is a schematic cross-sectional view similar to FIG. 1 and showing use of a field plate.

Turning now to FIG. 2, there is shown a cross-sectional view of a PN junction diode formed in a semiconductor substrate in which means is provided for altering the electric field distribution so that there is not such a high electric field concentration adjacent the surface of the semiconductor substrate. In FIG. 2, a semiconductor substrate 17, which may be N-type silicon for example, has a region 18 of opposite conductivity type formed therein to define a PN junction 19 therebetween. A layer of insulating material 21 such as silicon dioxide is formed on the top surface of the semiconductor substrate 17 and covers the periphery of the suubstrate surrounding the PN junction 19 as well as the edge portions of the PN junction 19 which come up to the top surface of the semiconductor substrate 17. Metallization 22 is provided as before which contacts an inner area of the P-type region 19 and forms an electrical contact thereto. However, in the construction shown in FIG. 2 this metallization 22 is extended out over the layer of silicon dioxide 21 and overlies the periphery of the semiconductor substrate 17 surrounding the PN junction 19. Thus, the metallization 22 has integral portions **22*a* extending out over the periphery of the semiconductor substrate surrounding the PN junction 19 to form a field plate. As schematically illustrated in FIG. 2 typically portions 22*a* are of a thickness greater than the portion of the metallization 22 disposed directly on P-type region 18. The portion of the metallization 22 disposed directly on the P-type region 18 has to be thin enough so that electrons from an electron gun may penetrate therethrough to contact the P-type region 18. The dotted lines in FIG. 2 are a plot of the equipotential lines for the device schematically illustrated therein under the same reverse bias conditions as the diode shown in FIG. 1. It can be seen that the field plate portions 22*a*** of the metallization alter the electric field intensity in the semiconductor substrate. The arrangement of FIG. 2 generally produces a lower electric field intensity at the surface of the semiconductor substrate for a given voltage than for the arrangement shown in FIG. 1.

Figure 3:
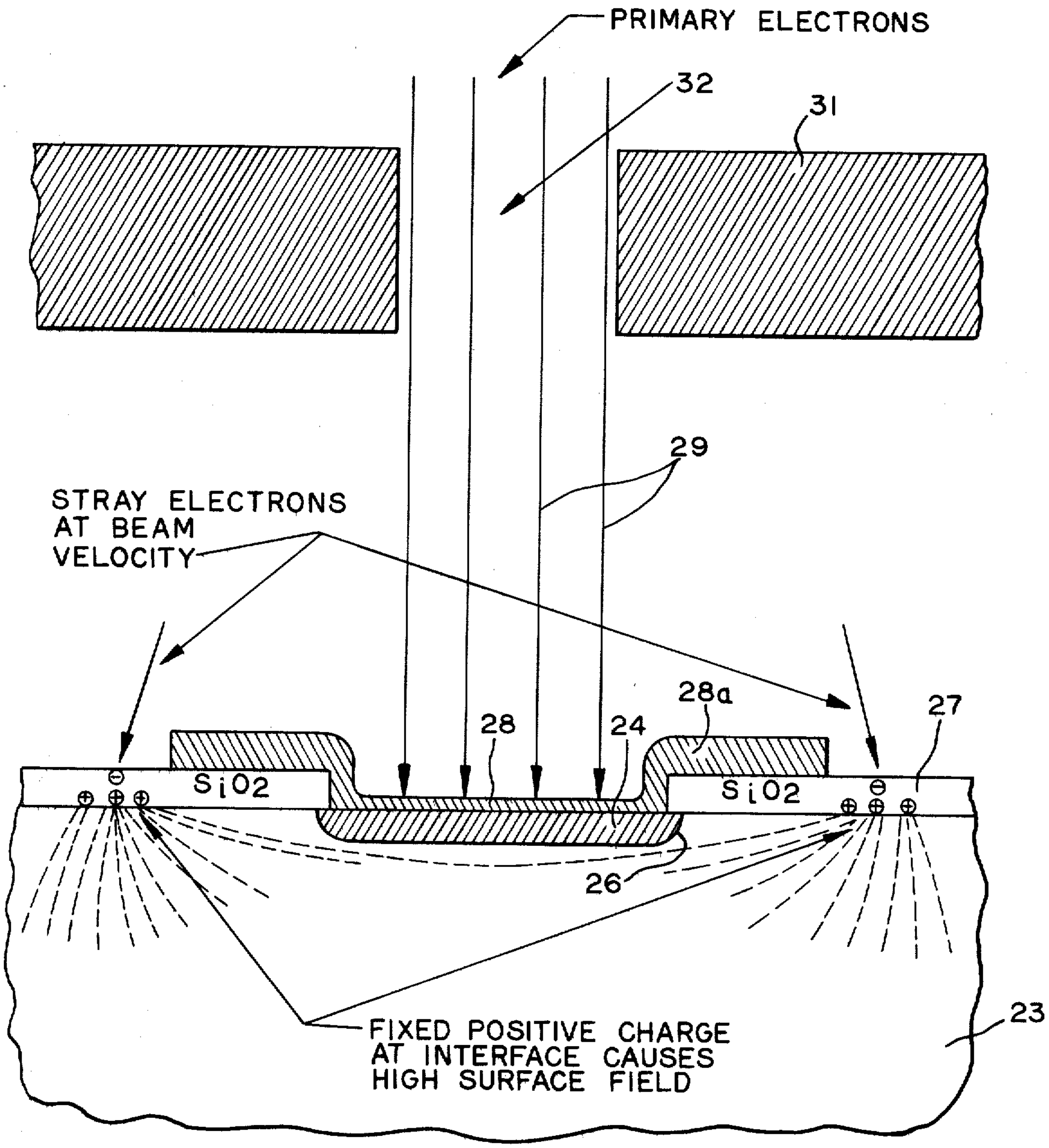
FIG. 3 is a schematic cross-sectional view of a portion of a semiconductor target for use in electron bombarded semiconductor devices.

Turning now to the FIG. 3, there is shown in schematic cross-sectional form a portion of a semiconductor target for use in electron bombarded semiconductor devices. A semiconductor substrate 23, which may be N-type silicon for example, has a region of P-type conductivity 24 formed therein to define a PN junction 26 therebetween. A layer of insulating material 27, which may typically be silicon dioxide, is disposed on portions of the top surface of the substrate 23 covering the periphery of the substrate surrounding the PN junction 26 as well as the portions of the PN junction 26 which extend up to the top surface. A layer of metallization 28 is formed on the inner area of the P-type region 24 for providing electrical contact thereto and includes an integral field plate portion **28*a* which overlies the silicon dioxide 27 on top of the periphery of the semiconductor substrate 23 surrounding the PN junction 26. In electron bombarded semiconductor devices the thus formed PN junction diode is bombarded with an electron beam schematically indicated in FIG. 3 by reference numeral 29 from a suitable electron source (not shown). A metal beam shielding mask 31 is provided and is positioned external to and separated from the semiconductor target structure. The metal beam shielding mask 31 has suitable openings such as that indicated by reference numeral 32 which overlie inner areas of the P-type regions formed in the semiconductor N-type silicon substrate 23 for permitting the electron beam 29 to impinge thereon. The purpose of the metal beam shielding mask 31 is to prevent most stray electrons and x-rays, for example, from striking the exposed surfaces of the silicon dioxide layer 27 and also to provide a ground path for unwanted portions of the electron beam 29. In practice, however, it is virtually impossible to position the beam shield 31 to prevent all stray electrons from hitting the silicon dioxide layer 27. Perhaps the most serious effects are caused by elastic primary electrons which are visible from the silicon dioxide surface. Since the range of penetration of, for example, a ten KEV electron is 1.2 μm. in silicon dioxide, the electrons can penetrate to a depth which is extremely close to the interface between the silicon dioxide layer 27 and the N-type silicon substrate 23. The effect of these stray electrons (and x-rays which have an even greater penetration range) is to build up a fixed positive charge near the interface of the silicon substrate and the silicon dioxide. This charge causes a greater electric field to exist at the surface of the substrate 23** than was there before the radiation. This radiation damage reduces the diode breakdown or avalanche voltage to a lower level than the desired operating voltage, rendering the diode useless for electron bombarded semiconductor devices.

Figure 4:
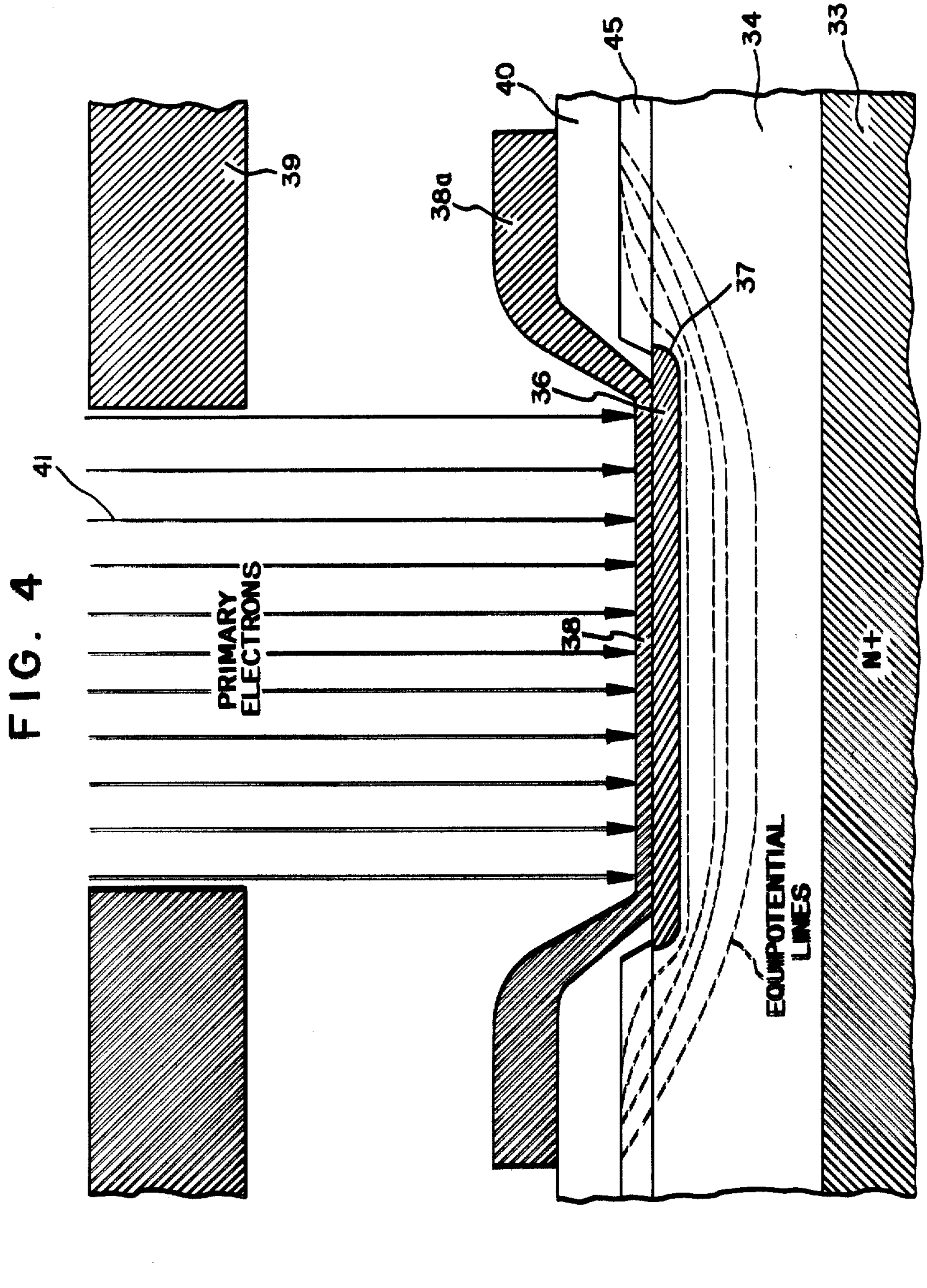
FIG. 4 is a schematic cross-sectional view similar to FIG. 3 and showing the use of a passivation layer.

Turning now to a consideration of FIG. 4, there is illustrated a schematic cross-sectional view of a semiconductor target somewhat similar to that shown in FIG. 3 but illustrating the use of a passivation layer covering the periphery of the semiconductor substrate surrounding the PN junction. Thus in FIG. 4 a semiconductor substrate 33, which may be N-type silicon for example, has an epitaxial N-type silicon region 34 formed thereon. A region of opposite conductivity 36 is suitably formed as by diffusing a P-type impurity into the top surface of the epitaxial layer 34 so that a PN junction 37 is formed. A relatively thin layer 38 of metallization is formed directly on the top surface of the semiconductor overlying an inner area of the P-type region 36 and functioning as an electrical contact thereto. As an example, the layer of metallization 38 may have a thickness of 1,000 A. As before, a beam shielding mask 39 is provided having apertures generally aligned with inner areas of underlying PN junction diodes so as to permit a beam of electrons 41 to pass through an impinge on the diodes. In the arrangement shown in FIG. 4 a layer of passivating material 40 is disposed on the periphery of the semiconductor epitaxial N-type region surrounding the PN junction 37. Actually, in thhe embodiment shown in FIG. 4 there are two layers of passivating material. These layers comprise a layer 40 of phosphorus doped silicon dioxide disposed on top of a layer 45 of silicon dioxide. Different arrangements are possible. The simplest arrangement is a single passivating layer of silicon dioxide. However, a single thermally grown layer of silicon dioxide cannot usually be practically grown to a thickness greater than about 1 micron. It has been found that merely providing such a 1 micron layer of silicon dioxide is not the most satisfactory arrangement in that radiation damage occurs as discussed hereinbefore which reduces the diode breakdown or avalanche voltage. Improved performance can be obtained by using a 5% phosphorus doped silicon dioxide as a passivation layer. It has been found, however, that the most satisfactory passivation layer comprises actually two separate layers as illustrated in FIG. 4. The layer 45 is simple silicon dioxide which may be thermally grown to a thickness of, for example, one micrometer. The additional layer 40 is a layer of 5% phosphorus doped silicon dioxide which is deposited to a thickness of 2 micrometers. In this matter the overall passivation layer has a substantial thickness. Furthermore, the phosphorus doping of the silicon dioxide traps positive ionic impurities which might otherwise migrate to the oxide-silicon interface producing an undesired positive charge.

As shown in FIG. 4 the relatively thin metallization 38 serving as an electrical contact to the P-type region 36 has integral portions **38*a* which are formed to a greater thickness and which extend out from the inner area of P-type region 37 over the top of the passivation layers disposed on the periphery of the semiconductor substrate surrounding the PN junction. As discussed before, this relatively thick metallization serves as a metal overlay or field plate for altering the equipotential lines of the electric field developed in the semiconductor under reverse bias conditions. This field plate also somewhat protects the passivation layer on the periphery of the semiconductor substrate surrounding the PN junction from radiation damage. In accordance with one embodiment, this relatively thick layer of metallization 38*a*** may be formed to have a thickness on the order of 10,000 A.

Figure 5:
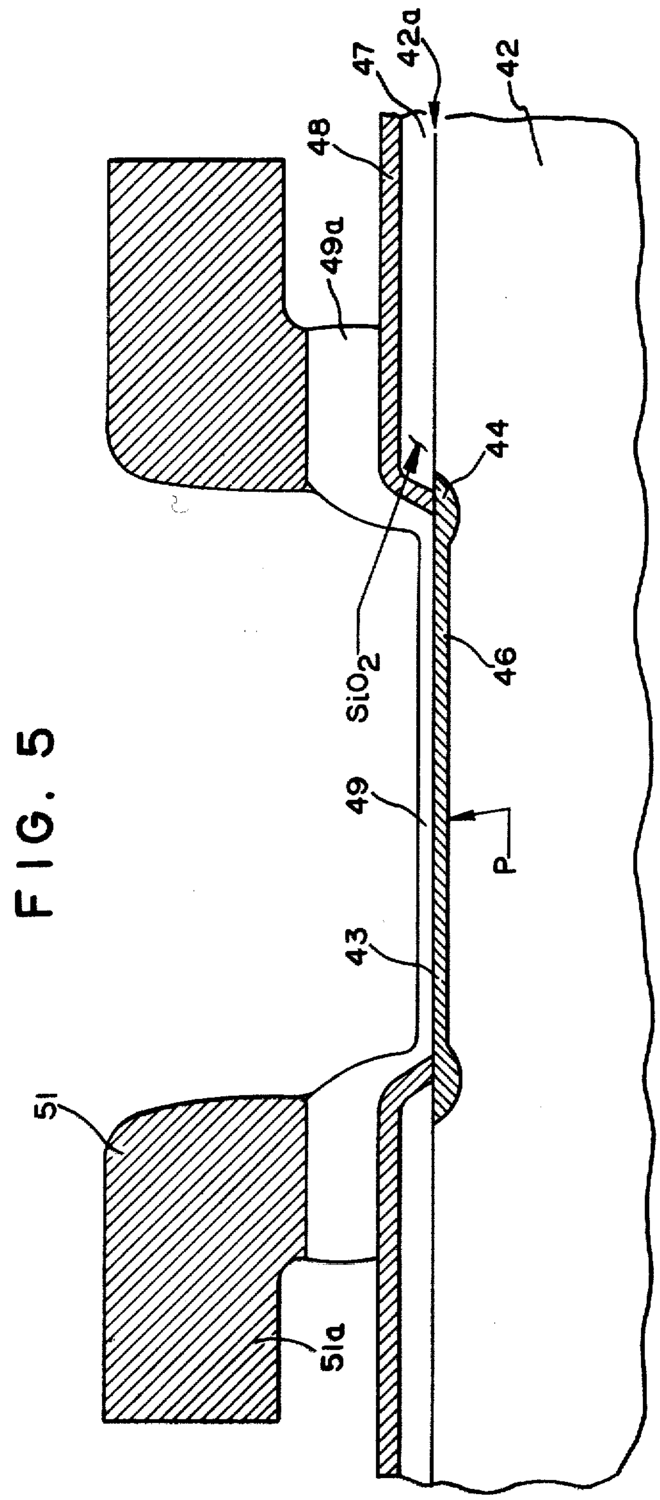
FIG. 5 is a schematic cross-sectional view of a semiconductor target having a beam shield.

Turning now to FIG. 5, there is shown a cross-sectional schematic illustration of a portion of a semiconductor target in accordance with this invention which includes a beam shield that is attached to the semiconductor target and extends over but is separated from portions of the target which it is desired to shield from radiation. Thus, in FIG. 5, a semiconductor substrate 42 is provided, which may as an example be N-type silicon, and which has a front surface **42*a*. A region of an opposite conductivity (i.e., P-type) 43 is formed in the semiconductor substrate 42 and extends therein from the front surface 42*a* thereof. As shown in FIG. 5, the periphery or edge of the P-type region 43 is indicated by reference numeral 44 comprises a deeper or thicker P-type region formed such as by diffusion in the semiconductor substrate 42.** This relatively deeper diffusion functions as a guard ring for improving yield and increasing breakdown voltage as known to those skilled in the semiconductor art. Thus, there results a PN junction diode.

A passivating layer is formed on the top surface of the semiconductor substrate 42 overlying the PN junction portions that extend to the surface and overlying the periphery of the semiconductor substrate 42 surrounding the PN junction. In the embodiment shown in FIG. 5, the passivating material comprises two layers 47 and 48. The layer 47 is a layer of silicon dioxide and the layer 48 comprises phosphorus doped silicon dioxide formed on top of the silicon dioxide and helping to prevent radiation damage as discussed hereinbefore. A thin layer of metallization 49 is provided directly on top of an inner area of the P-type region 46 and functioning as an electrical contact thereto. This metallization can comprise nickel-silicide for example. Relatively thick metallization **49*a* is formed integral to the metallization 49 and extending out over the PN junction edge portions and a portion of the periphery of the semiconductor substrate surrounding the PN junction. This relatively thick metallization 49*a* is formed on top of the phosphorus doped silicon dioxide 48** and functions as a field plate for altering the equipotential lines of the electric field developed within the semiconductor under conditions of reverse bias. As explained hereinbefore, this avoids or eliminates what otherwise would be a very high electric field intensity adjacent the surface of the semiconductor substrate.

In accordance with the invention, the relatively thick metallization **49*a* has a radiation shield 51 formed thereon. The radiation shield 51 has portions 51*a* which extend outwardly over but are spaced from the passivating material and the underlying periphery of the semiconductor substrate surrounding the PN junction. The radiation or beam shield 51 is formed of a suitable electron and x-ray absorbing material, such as a metal. The spacing between the portion of the radiation shield 51*a* and the semiconductor substrate is important because by having the radiation shield spaced from the substrate the capacitance associated with the PN junction diode is not substantially increased by the addition of the radiation shield or beam shield. For example, the radiation or beam shield such as shown in FIG. 5** has a much lower capacitance per unit area than does, for example, a simple field plate disposed directly on top of the passivating material overlying the periphery of the semiconductor substrate surrounding the PN junction. A high capacitance degrades the frequency response of the target so that for high frequency applications it is essential that the capacitance of the diode be kept to as low a value as possible. The purpose of the beam shield is primarily to extend radiation protection over the portion of the semiconductor device that has a high electric field, but which it is not desired to irradiate. By raising the beam shield above the surface, the electric field which is determined to the overlay is not substantially affected.

The specific diodes shown in the semiconductor targets illustrated in the FIGURES are shown as PN junction diodes. Rectifying contact or Schottky diodes are also utilized in semiconductor targets, and the present invention is equally applicable to shielding portions of the Schottky diode constructions.

Figure 6:
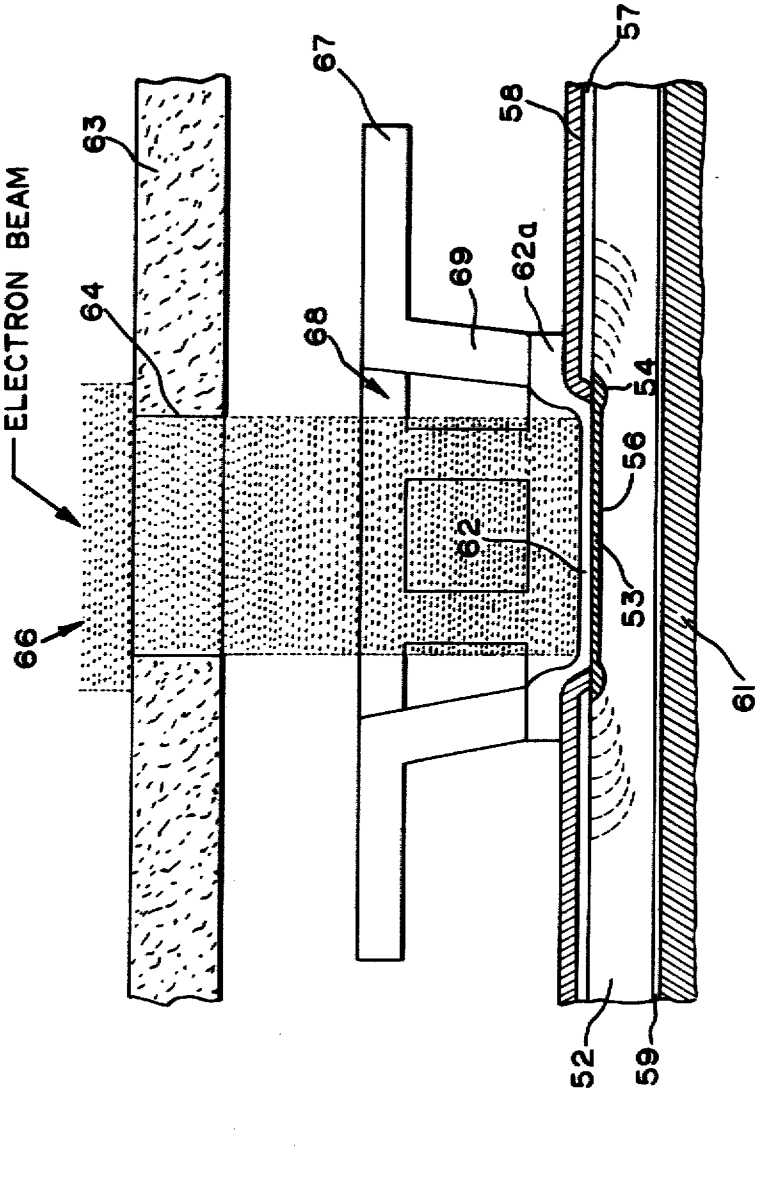
FIG. 6 is a schematic cross-sectional view of a semiconductor target having another type of beam shield.

In FIG. 6 there is shown a schematic cross-sectional view of another embodiment of the invention incorporating a radiation or beam shield and which is illustrated as used with PN junction diodes. A semiconductor substrate 52 is provided, which may as an example by N-type silicon. A region of an opposite conductivity type 53 (i.e., P-type) is formed in the front surface of the semiconductor substrate 52 and includes a guard ring 54 comprising a thicker region of opposite conductivity type at the lateral extent of the P-type region 53. Thus, there is formed a PN junction 56 defining a diode. A two layer construction of passivating material is disposed on those portions of the top surface of the semiconductor substrate 52 expecting an inner area of the P-type region 53. This two layer construction may comprise a layer 57 of thermal silicon dioxide with an overlying layer 58 of phosphorus doped silicon dioxide disposed thereon. In accordance with some applications of the invention, the semiconductor substrate 52 may have a back contact region 59 comprising for example N+ type silicon. Also in accordance with certain embodiments of the invention a heat sink 61 may be provided adjacent the back contact for absorbing and dissipating the substantial amount of heat developed during the high power operation of the semiconductor target.

A relatively thin layer of metallization such as nickel-silicide 62 is formed directly on top of the inner area of the P-type region 53 and serves as a electrical contact thereto. A beam shielding mask 63 is provided external to the semiconductor construction and includes an opening 64 generally aligned with the inner area of the P-type region 53 on which the relatively thin layer of metallization 62 is disposed. An electron beam generally indicated by reference numeral 66 is generated by an electron gun (not shown) and admitted through the opening 64 for penetrating through the relatively thin layer of metallization 62 and striking the inner area of the P-type region 53. In accordance with this embodiment of the invention a relatively thick metallization 62*a* which is integral to the metallization 62 is formed overlying the passivating material which in turn overlies the vicinity of the PN junction. A radiation or beam shield 67 is provided which has an inner opening generally indicated by reference numeral 68 for permitting the passage of an electron beam therethrough so as to strike a desired portion of the semiconductor target (such as the inner area of the P-type conductivity region 62). The beam shield 67 has outwardly extending regions which are generally planar and parallel to the top surface of the semiconductor substrate but are spaced therefrom and extend out over the periphery of the semiconductor substrate surrounding the PN junction and the passivating materials disposed thereon. The radiation or beam shield 67 is integrally formed with the semiconductor target and attached thereto by mounting means such as the pillars 69 shown in FIG. 6. In accordance with the invention the pillars 69 and the radiation or beam shield 67 are formed of suitable electron and x-ray absorbing material, such as metal for example. As an example, the metal gold has been found to work very satisfactorily for purposes of shielding portions of the semiconductor target. The spacing of the radiation or beam shield 67 from the surface of the semiconductor substrate is important as has been hereinbefore discussed. Simply providing a field plate type of construction in which a metal beam shield is disposed directly on top of the passivating material overlying the periphery of the semiconductor substrate surrounding the PN junction substantially increases the capacitance per unit area of the diode structure. As discussed before, such increased capacitance degrades the frequency response of the diode and hence the semiconductor target. As mentioned before, the beam shield in accordance with this invention extends radiation protection over that portion of the semiconductor device that has a high electric field and which it is desired to not irradiate. By raising the beam shield above the surface, the electric field determined by the overlay is not substantially affected. Another important feature of the invention is that the beam shield is integrally formed with and attached to the semiconductor target. This precludes the alignment difficulties which would result if it were attempted to provide a beam shield separate from and not attached to the semiconductor target.

There are two parameters which must be determined for an idealized application of the beam shield of this invention to a semiconductor diode target. These two parameters are the width of the beam shield and its height about the semiconductor surface. Ideally, the electrical design of the diode is analyzed and equipotential lines plotted which produce the highest breakdown voltage and minimum capacitance in the junction periphery. The beam shield can then be designed so that it is sufficiently wide to shield completely the region where high electric fields occur at the periphery of the diode. The other parameter, the height of the beam shield above the semiconductor surface, can be determined by requiring that the idealized equipotential profiles not be substantially affected by the presence of the beam shield. For an ideal application of the invention, each particular target construction requires a separate determination of the height of the beam shield and its width. As an example, in one particular application a semiconductor diode target with a reverse breakdown voltage of greater than 300 volts was formed with an integral beam shield, such as shown in FIG. 6, which was spaced 8 $\mu$m above the passivated surface and which has a width of 100 $\mu$m.

Radiation resistance to electron beam bombardment is thus achieved by complete shielding of the diode junction periphery. The integral beam shield eliminates or substantially reduces the charge trapping in the passivating layer by shielding this critical diode region from the electron beam. The beam shield can be fabricated using gold deposition or deposition of other metals of sufficient thickness to completely absorb the incident beam electrons. As an example the penetration range of 15 KEV electrons is typically 3 $\mu$m in silicon. In accordance with the invention and as an example, the beam shield metallization is typically 10 to 15 $\mu$m in thickness.

In a method of forming the radiation or beam shields in accordance with the invention, the pattern of the relatively thick portions of metallization 62*a* (which may be referred to as a field plate) is delineated through photolithographic techniques and gold plated to form the relatively thick layers of metallization 62*a*. Then, using photolithographic techniques a mask is used to define the pillars 69 to be plated onto the field plate. The pillars are then plated with gold to the desired height above the surface of the semiconductor. After forming the pillars 69, a well controlled thickness of resist is put down and patterned to expose the tops of the pillars 69. Next, a thin layer of gold is deposited on top of the resist. Subsequently, more resist is applied and patterned in the shape of the radiation or beam shield 67. Gold is then plated on the thus patterned resist to form the beam shield. Subsequently, all resist is removed. A structure such as shown in FIG. 6 results with the beam shield 67 being integrally mounted to the semiconductor through the pillars 69 and being spaced from the top surface of the semiconductor and the passivating material covering it. Thus, with the construction shown in FIG. 6, complete electron beam shielding of the PN junction periphery is accomplished without a substantial increase in the diode capacitance. Further, with a semiconductor target incorporating the radiation or beam shield of this invention in an integral fashion, it is not necessary that an external beam shielding mask be aligned to any close tolerances with respect to the semiconductor target, as has been the case with respect to prior art constructions.

Figure 7:
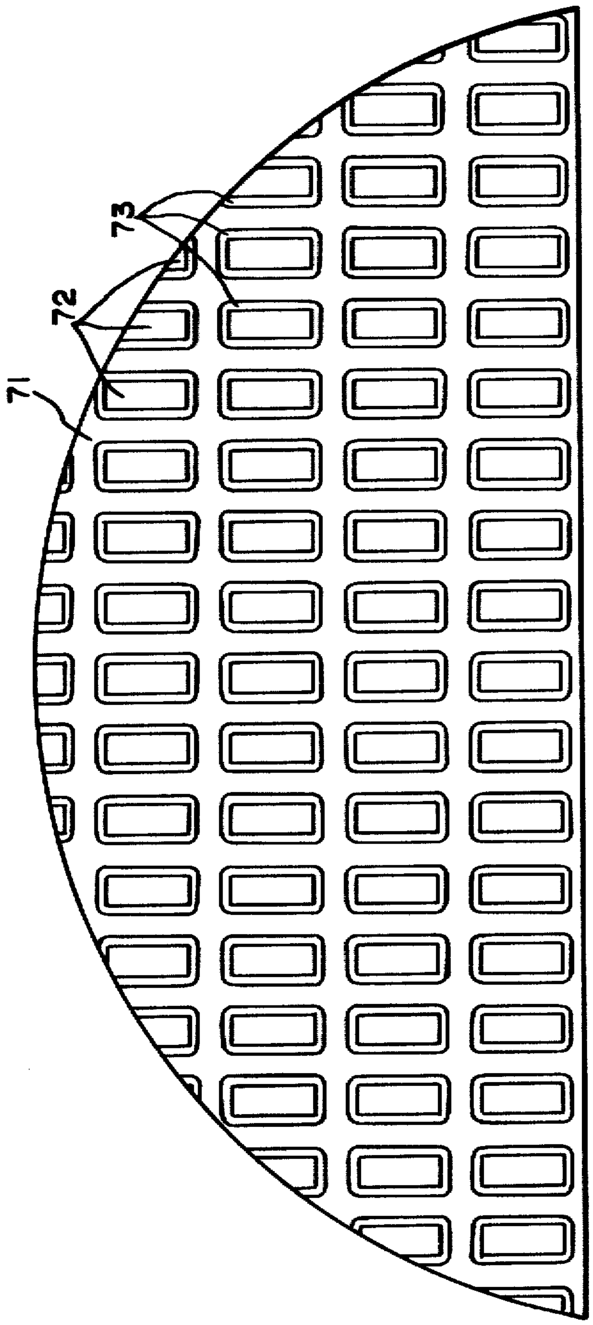
FIG. 7 is a top plan view of a semiconductor target having an array of diodes with integral beam shields.

Throughout the preceding description the semiconductor target construction in accordance with this invention has been discussed with respect to one PN junction diode formed in a semiconductor substrate. Typically, for applications such as an electron bombarded semiconductor target, a plurality of PN junction diodes are formed in a single substrate. FIG. 7, for example, shows a top plan view of a semiconductor wafer 71 which has a plurality of PN junction diodes generally indicated by reference numeral 72 formed therein. Each of the diodes 72 has an integral beam shield 73 formed in association therewith in the manner cross-sectionally illustrated in FIG. 6.

Also, the present invention is equally applicable to shielding portions of a semiconductor target formed of one or more rectifying contact or Schottky diodes.

We claim:

1. In a semiconductor device of the type including an evacuated envelope and a gun positioned at one end of the envelope to project radiation along the envelope, a semiconductor target spaced from the gun to receive the radiation and comprising a semiconductor substrate having a front surface oriented towards the radiation, at least one diode formed in said semiconductor substrate and extending to said front surface, a passivating layer formed on said front surface covering all but the inner portion of said diode and being of a thickness to inhibit penetration of radiation, a beam shield of radiation-absorbing matefial, mounting means carried by said semiconductor substrate front surface for mounting said beam shield at the periphery of said semiconductor substrate surrounding the diode and in spaced relationship to said passivating layer, said beam shield extending out over the periphery of said semiconductor substrate adjacent said at least one diode for shielding said periphery from the radiation, said beam shield having a central opening aligned with an inner portion of said diode for permitting said radiation to strike said inner portion.

2. A semiconductor target in accordance with claim 1 wherein said diode is a PN junction diode.

3. A semiconductor target in accordance with claim 1 wherein said diode is a Schottky diode.

4. A semiconductor target in accordancce with claim 1 wherein said mounting means for mounting said beam shield to said semiconductor substrate in spaced relationship thereto includes carrying said shield by said passivating layer being of a thickness to inhibit penetration of radiation.

5. A semiconductor target in accordance with claim 4 including a metallization overlay formed on said layer of passivating material surrounding said diode inner portion.

6. In an electron bombarded semiconductor device of the type including an evacuated envelope and an electron gun positioned at one end of the envelope to project an electron beam along the envelope, a semiconductor target spaced from the electron gun to receive the beam and comprising a semiconductor substrate of one conductivity type having a front surface oriented towards the electron beam, a region of a second conductivity type opposite said first type formed in said semiconductor substrate extending down into said substrate from said front surface and defining a PN junction, a passivating layer formed on said front surface covering all but the inner portion of said diode and being of a thickness to inhibit penetration of radiation, an electron beam shield of electron-absorbing material, mounting means carried by said semiconductor substrate front surface for mounting said electron beam shield to said semiconductor substrate in spaced relationship to said passivating layer, said means including carrying said shield by said passivating layer being of a thickness to inhibit penetration of radiation, said electron beam shield extending out over the periphery of said semiconductor substrate adjacent said PN junction for shielding said periphery from the electron beam, said electron beam shield having a central opening generally coextensive with an inner area of the front surface of said region of conductivity type for permitting the electron beam to strike said inner area.

7. Apparatus in accordance with claim 6 said layer including a layer of passivating material disposed on said front surface and covering said region of second conductivity type except for the inner area thereof, and also covering portions of said PN junction which extend to said front surface and the periphery of said semiconductor substrate surrounding said PN junction.

8. Apparatus in accordance with claim 7 including contact means formed on said inner area of the front surface of said second conductivity type region.

9. Apparatus in accordance with claim 8 wherein said contact means comprises a relatively thin layer of metallization formed directly on said inner area of the front surface of said second conductivity type region.

10. Apparatus in accordance with claim 9 including a relatively thick layer of metallization formed on said layer of passivating material overlying the vicinity of said PN junction, said relatively thick layer of metallization being integrally formed with said relatively thin layer of metallization.

11. Apparatus in accordance with claim 10 wherein mounting means for mounting said electron beam shield comprises pillars formed on said relatively thick layer of metallization and extending generally upwards a predetermined distance, said electron beam shield being fixedly attached to said pillars.

12. Apparatus in accordance with claim 10 including a beam shielding mask spaced from the surface of said semiconductor substrate, said beam shielding mask having an opening generally aligned with said inner area of said region of second conductivity type.

13. Apparatus in accordance with claim 10 wherein said semiconductor substrate is on N-type conductivity and said region of second conductivity type material is P-type conductivity material.

* * * * *